United States Patent [19]
Tse et al.

[11] Patent Number: 5,659,717
[45] Date of Patent: Aug. 19, 1997

[54] METHODS FOR PARTITIONING CIRCUITS IN ORDER TO ALLOCATE ELEMENTS AMONG MULTIPLE CIRCUIT GROUPS

[75] Inventors: John Tse, El Cerrito; David W. Mendel, Sunnyvale, both of Calif.

[73] Assignee: Altera Corporation, San Jose, Calif.

[21] Appl. No.: 508,401

[22] Filed: Jul. 31, 1995

[51] Int. Cl.$^6$ .................................................. G06F 17/50
[52] U.S. Cl. ...................... 395/500; 364/488; 364/489; 364/490; 364/491
[58] Field of Search ........................... 395/500; 364/148, 364/488, 489, 490, 491, 468; 437/250

[56] References Cited

U.S. PATENT DOCUMENTS

| | | | |
|---|---|---|---|
| 4,495,559 | 1/1985 | Gelatt, Jr. et al. | 364/148 |
| 4,577,276 | 3/1986 | Dunlop et al. | 364/491 |
| 4,593,363 | 6/1986 | Burstein et al. | 364/491 |
| 4,609,986 | 9/1986 | Hartmann et al. | 364/200 |
| 4,617,479 | 10/1986 | Hartmann et al. | 307/465 |
| 4,677,318 | 6/1987 | Veenstra | 307/465 |
| 4,713,792 | 12/1987 | Hartmann et al. | 364/900 |
| 4,774,421 | 9/1988 | Hartmann et al. | 307/465 |
| 4,871,930 | 10/1989 | Wong et al. | 307/465 |

(List continued on next page.)

OTHER PUBLICATIONS

"A New Simultaneous Circuit Partitioning and Chip Placement Approach Based on Simulated Annealing", by A. Chatterjee et al., 27th ACM/IEEE Design Automation Conference, 1990, pp. 36–39.

"The Optimal Circuit Decompositions Using Network Flow Formulations", by C. Cheng, Circuits and Systems, 1990 IEEE International Symposium, pp. 2650–2653.

"A Unified Approach to Partitioning and Placement", by R. Tsay et al., IEEE Transactions on Circuits and Systems, vol. 38, No. 5, May 1991, pp. 521–533.

(List continued on next page.)

*Primary Examiner*—Kevin J. Teska
*Assistant Examiner*—Russell W. Frejd
*Attorney, Agent, or Firm*—Fish & Neave; Robert R. Jackson

[57] ABSTRACT

Improved circuit partitioning methods are provided which combine the advantage of multiple starting positions of the random initial placement approach with the advantage of optimal starting positions of the greedy initial placement approach, by starting with greedy initial placement and modifying partitioning constraints on subsequent passes so that each pass begins in a new position, In addition, the partitioning goals of interconnection minimization and resource utilization efficiency may be prioritized according to a design goal by manipulating the manner in which partitioning constraints are changed during each partitioning pass. Furthermore a user may adjust the weight of the benefits for eliminating existing interconnections and the weight of the penalties for adding new interconnections in accordance with a design goal.

12 Claims, 6 Drawing Sheets

U.S. PATENT DOCUMENTS

| | | | |
|---|---|---|---|
| 4,899,067 | 2/1990 | So et al. | 307/465 |
| 4,908,772 | 3/1990 | Chi | 364/491 |
| 4,912,342 | 3/1990 | Wong et al. | 307/465 |
| 4,918,614 | 4/1990 | Modarres et al. | 364/490 |
| 5,113,352 | 5/1992 | Finnerty | 364/490 |
| 5,121,006 | 6/1992 | Pedersen | 307/465 |
| 5,187,784 | 2/1993 | Rowson | 395/500 |
| 5,218,551 | 6/1993 | Agrawal et al. | 364/491 |
| 5,220,214 | 6/1993 | Pedersen | 307/465 |
| 5,224,056 | 6/1993 | Chene et al. | 364/490 |
| 5,237,514 | 8/1993 | Curtin | 364/490 |
| 5,251,147 | 10/1993 | Finnerty | 364/490 |
| 5,260,610 | 11/1993 | Pedersen et al. | 307/465 |
| 5,260,611 | 11/1993 | Cliff et al. | 307/465 |
| 5,308,798 | 5/1994 | Brasen et al. | 437/250 |
| 5,341,308 | 8/1994 | Mendel | 364/489 |
| 5,349,536 | 9/1994 | Ashtaputre et al. | 364/491 |
| 5,350,954 | 9/1994 | Patel | 307/465 |
| 5,359,537 | 10/1994 | Saucier et al. | 364/489 |
| 5,359,538 | 10/1994 | Hui et al. | 364/491 |
| 5,371,422 | 12/1994 | Patel et al. | 326/41 |
| 5,495,419 | 2/1996 | Rostoker et al. | 364/468 |
| 5,506,788 | 4/1996 | Cheng et al. | 364/491 |
| 5,513,124 | 4/1996 | Trimberger et al. | 364/491 |
| 5,521,837 | 5/1996 | Frankle et al. | 364/491 |
| 5,557,533 | 9/1996 | Koford et al. | 364/491 |
| 5,568,636 | 10/1996 | Koford | 395/500 |

OTHER PUBLICATIONS

"On the Graph Bisection Problem", by Y. Saab et al., IEEE Transactions on Circuits and Systems—Part 1: Fundamental Theory and Applications, vol. 39, No. 9, Sep. 1992, pp. 760–762.

"ML–Germinal: A New Heuristic Standard Cell Placement Algorithm", by A. Dahmani et al., IEEE European Design Automation Conference, 1993, pp. 184–188.

"A Generic Floorplanning Methodology", by M. Mortazavi et al., IEEE Autotestcon, Sep. 1994, pp. 749–763.

"Min–Cut Placement with Global Objective Functions for Large Scale Sea–of–Gates Arrays", by K. Takahashi et al., IEEE Transactions on Computer–Aided Design of Integrated Circuits and Systems, vol. 14, No. 4, Apr. 1995, pp. 434–446.

"On the Integration of Partitioning and Global Routing for Rectilinear Placement Problems", by C. Yeh et al., IEEE Transactions on Computer–Aided Design of Integrated Circuits and Systems, vol. 15, No. 1, Jan. 1996, pp. 83–91.

Breuer, Melvin A., "A Class of Min–Cut Placement Algorithms", Dept. Of Elec. Engng. & Comp. Sci., University of Southern California, pp. 284–290.

Fiduccia, C.M., et al., "A Linear–Time Heuristic for Improving Network Partitions", *19th Design Automation Conference*, 1982, pp. 241–247.

Kernighan, B.W., et al., "An Efficient Heuristic Procedure for Partitioning Graphs", *Bell Sys. Tech. Jour.*, pp. 291–307 (1970).

Krishnamurthy, Balakrishnan, "An Improved Min–Cut Algorithm For Partitioning VLSI Networks", *IEEE Trans. On Comp*, vol. C–33, No. 5, May 1984, pp. 438–446.

Schweikert, D.G., et al., "A Proper Model for the Partitioning of Electrical Circuits", *Proceedings of the 9th Design Automation Workshop*, 1979, pp. 57–62.

| LINE NO. | SYMBOL | MEANING |
|---|---|---|
| 1 | $\Gamma_k(C)$ | Gain cost function for cell C (Gain vector from reference (5)) |
| 2 | $f_1$(FACTOR) | Increasing function increases the value of FACTOR |
| 3 | $f_2$(FACTOR) | Reducing function decreases the value of FACTOR |

FIG. 1

METHODS FOR PARTITIONING CIRCUITS IN ORDER TO ALLOCATE ELEMENTS AMONG MULTIPLE CIRCUIT GROUPS

BACKGROUND OF THE INVENTION

This invention relates to the design of circuits with complex interconnections between circuit elements, and more particularly to methods for allocating interconnected circuit elements between two or more circuit element groups so that the number of interconnections required between the groups is minimized or at least substantially reduced, and methods for manipulating the methods of allocation of interconnected circuit elements to accomplish one or more design objectives.

In the design of large circuits, such as very large scale integrated ("VLSI") logic circuits, it is frequently necessary to subdivide the circuitry so that it can be implemented in two or more relatively discrete parts of one device or in two or more discrete devices. The circuit elements must be allocated between these two or more groups so that the number of interconnections required between the groups is not excessive. This systematic allocation of circuit elements is known as partitioning. One goal of partitioning is the reduction of interconnection between groups, because minimization of interconnections often results in a faster circuit, and because the number of interconnections is often a limiting factor in device resource utilization. An additional goal in partitioning is an even allocation of circuit elements among the groups so that the resources (e.g., space, etc.) in each group are utilized as efficiently as possible.

Partitioning has been extensively considered in the literature and prior art. See, for example, (1) B. W. Kernighan and S. Lin, "An Efficient Heuristic Procedure for Partitioning Graphs", The Bell System Technical Journal, February 1970, pp. 291–307 (see also U.S. Pat. No. 3,617,714); (2) D. G. Schweikert and B. W. Kernighan, "A Proper Model for the Partitioning of Electrical Circuits", Proceedings of the 9th Design Automation Workshop, 1979, pp. 57–62; (3) C. M. Fiduccia and R. M. Mattheyses, "A Linear-Time Heuristic for Improving Network Partitions", 19th Design Automation Conference, 1982, pp. 241–47; (4) B. Krishnamurthy, "An Improved Min-Cut Algorithm for Partitioning VLSI Networks", IEEE Transactions on Computers, Vol. C-33, No. 5, May 1984, pp. 438–46; and (5) commonly assigned U.S. Pat. No. 5,341,308 of D. Mendel, entitled "Methods for Allocating Circuit Elements Between Groups," all of which are hereby incorporated by reference herein. Partitioning methods of the general type employed in the present invention are believed to have originated with reference (1) above, and to have progressed through additional enhancements in order with references (2), (3), (4), and (5). The present invention comprises further modifications and improvements to the techniques shown and described in reference (5).

As noted above, one goal of a partitioning method is to partition or divide a set of circuit elements or "cells" connected by wires into two or more circuit element groups such that the number of wires which cross from one group to the other is minimized or at least substantially reduced. Another goal of a partitioning method is to ensure that when the cells are placed into various circuit element groups, the distribution of the cells among the groups is as even as possible.

A circuit element group, as that term is employed herein, may be a discrete device such as an integrated circuit or a printed circuit board, or it may be a relatively discrete part of a larger device. For example, the two or more circuit element groups mentioned above may be two or more relatively discrete parts of a single integrated circuit such as a programmable logic array device. In the literature a set of cells connected by a common wire is generally referred to as a net. In at least the later references identified above (e.g., references (2)–(5)), a net can include any number of cells. Partitioning involves moving cells from one circuit element group to the other in an effort to reduce the number of connections required between the resulting circuit element groups.

The prior art (and the present invention) provides methods for allowing various solutions to the partitioning problem to be tried in a systematic way in order to more rapidly and efficiently find the circuit element moves which give the best result. The present invention further provides methods for manipulating partitioning schemes to accomplish various design goals.

In the above-mentioned prior art, partitioning generally consists of two phases. The first partitioning phase involves the initial placement of the cells into the circuit element groups. The second partitioning phase involves performing a partitioning operation (such as disclosed in references (4) and (5)) to re-allocate the placed cells among the circuit element groups to minimize the interconnections between circuit element groups.

The initial placement and the subsequent partitioning is subject to one or more "chip constraints" which may restrict or encourage particular cell placement or movement. The various chip constraints are described in the prior art references (1) through (5). One chip constraint which is particularly relevant to the present invention is the cell capacity (i.e., the room available for cell placement) in a particular circuit element group. Partitioning is also subject to one or more circuit constraints which include but are not limited to: the number of circuit element groups, maximum number of interconnections, requirements that certain circuit elements group be connected.

Partitioning is typically implemented by using one of two approaches for the first partitioning phase. In the first approach, a "random initial placement" is performed during the first phase. Random initial placement places cells into the circuit element groups randomly, only obeying the chip and circuit operation, such as disclosed in reference (4) or (5) is performed on the circuit element groups in order to improve the partition. The resulting partition is then saved, and the process may be repeated a number of times with each new partition being compared to the best (i.e., most advantageous) previously saved partition, so that the best partition of the two being compared is saved, while the inferior partition is discarded. The random initial placement approach has the advantage of allowing multiple starting positions for each partitioning operation pass and then allowing a choice of the best result from all the passes. However, partitioning using random initial placement has the disadvantage that the random starting positions may be far from the optimal partition for a particular set of circuit element groups. As a result, the partitioning operation may require an excessive number of passes to approach the optimal partition.

In the second approach, a "greedy initial placement" is performed during the first phase. Greedy initial placement places cells into the circuit element groups one at a time, with each placement decision being based on the position of the previously placed cell. Similarly to the first approach, greedy initial placement is also subject to circuit and chip constraints. During the second phase, a partitioning operation, such as disclosed in reference (4) or (5), is performed on the circuit element groups in order to improve the partition. The resulting partition is then saved.

Unlike the random initial placement approach, greedy initial placement does not have the ability to come up with different solutions on different passes of the partitioning operation. The greedy initial placement approach has the advantage of starting with a better partition than random initial placement, thus requiring less phase two partitioning to approach the optimal solution. However, during subsequent passes, reference (4) or (5) partitioning always starts partitioning in the same position, thus limiting the variation in resulting partitions.

It would therefore be desirable to combine the advantage of multiple starting positions of the random initial placement approach with the advantage of optimal starting positions of the greedy initial placement approach, without the disadvantages of either approach.

When partitioning cells into circuit element groups, the best partition found (in terms of minimized interconnections) may result in an uneven distribution of cells where some circuit element groups may be nearly full, while other groups may be less than half full. Thus, even an optimal partition with a minimal amount of interconnections may be inefficient in that while some circuit element groups are forced to support a large number of cells, other circuit element groups are not being fully utilized. The prior art references have attempted to deal with this problem by imposing an additional goal for partitioning in the form of a "balance" circuit constraint, which requires allocation of cells among the circuit element groups to be even. Thus, the balance constraint is intended to ensure that the resources (e.g., cell capacity, etc.) in each group are utilized as efficiently as possible.

Reference (5) provided an enhancement to the traditional balance constraint in the form of the ability to temporarily suspend the balance requirement to accomplish an advantageous cell placement, while restoring balance in later cell moves. Nevertheless, traditionally, the goal of maximization of chip and circuit resource utilization efficiency (via the balance constraint) and the goal of minimization of interconnections (via partitioning) were held to be of equal importance. However, the prior art references have failed to account for situations where one or the other partitioning goal is of secondary importance due to a particular design goal. For example, the design goal for a particular circuit may dictate that the circuit be optimized for speed regardless of resource utilization, thus making the balance constraint of secondary importance. A design goal for another circuit may dictate that efficient fitting of cells into circuit element groups is of primary importance, thus relegating the reduction of interconnections to a secondary role. This design goal is likely where a large amount of cells needs to be placed in a limited amount of circuit element groups. It would therefore be desirable to provide partitioning methods which allow the partitioning goals of interconnection minimization and resource utilization efficiency to be prioritized according to a design goal.

In prior art references (1)–(4) it was generally assumed that dividing the cells of a net between two circuit element groups requires an interconnection with two terminals: one for the output from one circuit element group, and one for the input to the other circuit element group. In addition, each interconnection may have one or more pins connected to it from the various input and output (I/O) ports of one or more cells in each circuit element group. When a particular cell is moved from one circuit element group to another during partitioning, the move may have one or more of the following results: no change in the number of I/O pins and interconnections, a new I/O pin may be added to or removed from an existing interconnection, a new interconnection may be created, or an existing interconnection may be eliminated.

To determine the total benefit of a particular cell move, the prior art references introduced the concept of a "gain cost function" (called "gain vector" in references (4) and (5)) which treated the creation of each new I/O pin or a new interconnection as a penalty, and each removal of an existing I/O pin or an existing interconnection as a benefit. A gain cost function for a particular cell move is derived by subtracting the total penalties of that cell move from the total benefits. For example, if a particular cell, when moved, creates one new I/O pin (one penalty), but removes two existing interconnections (two benefits), the gain cost function of the move would be one benefit. The objective of each move is to maximize the gain cost function.

However, the traditional gain maximization approach is problematic in that the penalties for creation and the benefits of removal of I/O pins (which are internal to each circuit element group) are equal in weight to the penalties for creation and the benefits of removal of interconnections (which connect the circuit element groups). For example, the removal of an I/O pin or the elimination of an interconnection results in one benefit. Reference (5) provided an enhancement to the traditional gain cost function by adjusting the benefits and penalties of cell moves when moving cells between circuit element groups which include connections external to the circuitry being partitioned. However, the prior art approaches to calculating the gain cost function fail to account for the fact that in practical circuit design, the elimination of interconnections between circuit element groups may be of greater importance than the elimination of I/O pins within a particular circuit element group. It would therefore be desirable to provide partitioning methods which allow a user to adjust the weight of the benefits for eliminating existing interconnections and the weight of the penalties for adding new interconnections in accordance with a design goal.

In view of the foregoing, it is an object of this invention to provide improved circuit partitioning methods.

It is a more particular object of the invention to provide circuit partitioning methods which combine the advantage of multiple starting positions of the random initial placement approach with the advantage of optimal starting positions of the greedy initial placement approach, without the disadvantages of either approach.

It is another more particular object of the invention to provide circuit partitioning methods which allow the partitioning goals of interconnection minimization and resource utilization efficiency to be prioritized according to a design goal.

It is still another more particular object of the invention to provide circuit partitioning methods which allow a user to adjust the weight of the benefits for eliminating existing interconnections and the weight of the penalties for adding new interconnections in accordance with a design goal.

SUMMARY OF THE INVENTION

In a first aspect of the present invention, an improved partitioning method which combines the advantages of greedy initial placement and multiple starting positions, and allows prioritization of the partitioning goals of interconnection minimization and resource utilization efficiency in accordance with one or more design goals, is implemented in the following manner.

If the design goal of the partitioning operation is to minimize interconnections, apparent cell capacity for each chip is initially set equal to actual cell capacity. After initial cell placement and reference (4) or (5) partitioning, apparent cell capacity is reduced by a predetermined amount on each subsequent partition pass for chips which violate chip constraints. Excess cells from chips with lowered cell capacity are placed into different chips on the subsequent partitioning pass. As a result, each subsequent partition pass has a new starting point and thus produces a different result. During each partition pass, the current partition result is compared to the previous partition result. The best partition result is stored. At the end of the full partitioning operation, the stored partition result is returned as the optimal solution. Since the chips start with maximum available cell capacity, partitioning is less restricted on initial passes and thus provides a "natural clustering" of cells. Natural clustering is a partitioning phenomenon described in prior references which is believed to lead to fewer interconnections and thus a faster circuit.

If the design goal of the partitioning operation is to maximize chip resources and to evenly distribute cells among chips, apparent cell capacity for each chip is initially set to a fraction of its maximum value. After initial cell placement and reference (4) or (5) partitioning, apparent cell capacity is increased by a predetermined amount on each subsequent partition pass for chips which do not violate chip constraints, with maximum apparent cell capacity being limited by actual cell capacity. As a result, each subsequent partition pass has a new starting point and thus a different result. During each partitioning pass, the current partition result is compared to the previous partition result. The best partition result is stored. At the end of the full partitioning operation, the stored partition result is returned as the optimal solution. Since the chips start with a fraction of their actual cell capacity, cells are fitted into chips more tightly and evenly during the partitioning passes, thus utilizing chip resources with greater efficiency.

In a second aspect of the present invention, an improved partitioning method which allows a user to specify the relative importance of adding or eliminating interconnections versus adding or eliminating I/O pins prior to a reference (5) partitioning operation is provided. The second aspect of the present invention is implemented by allowing the user to set an interconnection to pin gain cost tradeoff ratio by selecting a gain cost modifier for creating and eliminating interconnections in accordance with a design goal. A reference (5) partitioning operation is then performed to produce a partition result and to calculate the gain cost of that partition using the gain cost modifier. If reference (5) partitioning fails due to violation of one or more circuit or chip constraints, multiple partitioning passes are performed, dynamically modifying the gain cost function on each pass by changing the gain cost modifier until a successful partition is found.

Further features, of the invention, its nature and various advantages will be more apparent from the accompanying drawings and the following detailed description of the preferred embodiments.

BRIEF DESCRIPTION OF THE DRAWINGS

FIG. 1 is a diagram explaining the meanings of several symbols used elsewhere in the specification and drawings.

DETAILED DESCRIPTION OF THE PREFERRED EMBODIMENTS

Figure 2A:
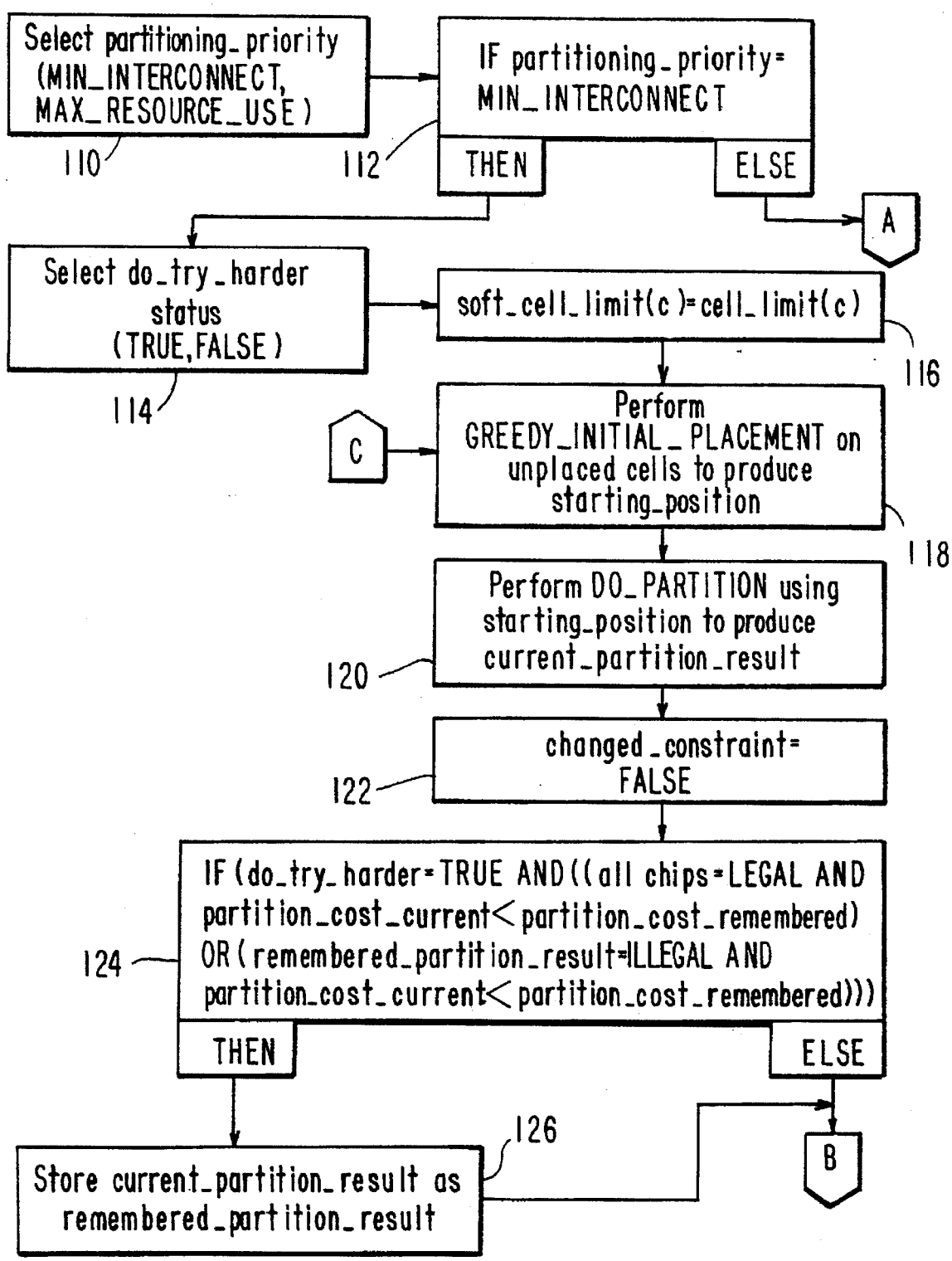
FIGS. 2a, 2b, 2c and 2d (hereinafter referred to collectively as FIG. 2) is a flow chart of an illustrative embodiment of a first aspect of the invention.
Figure 2B:
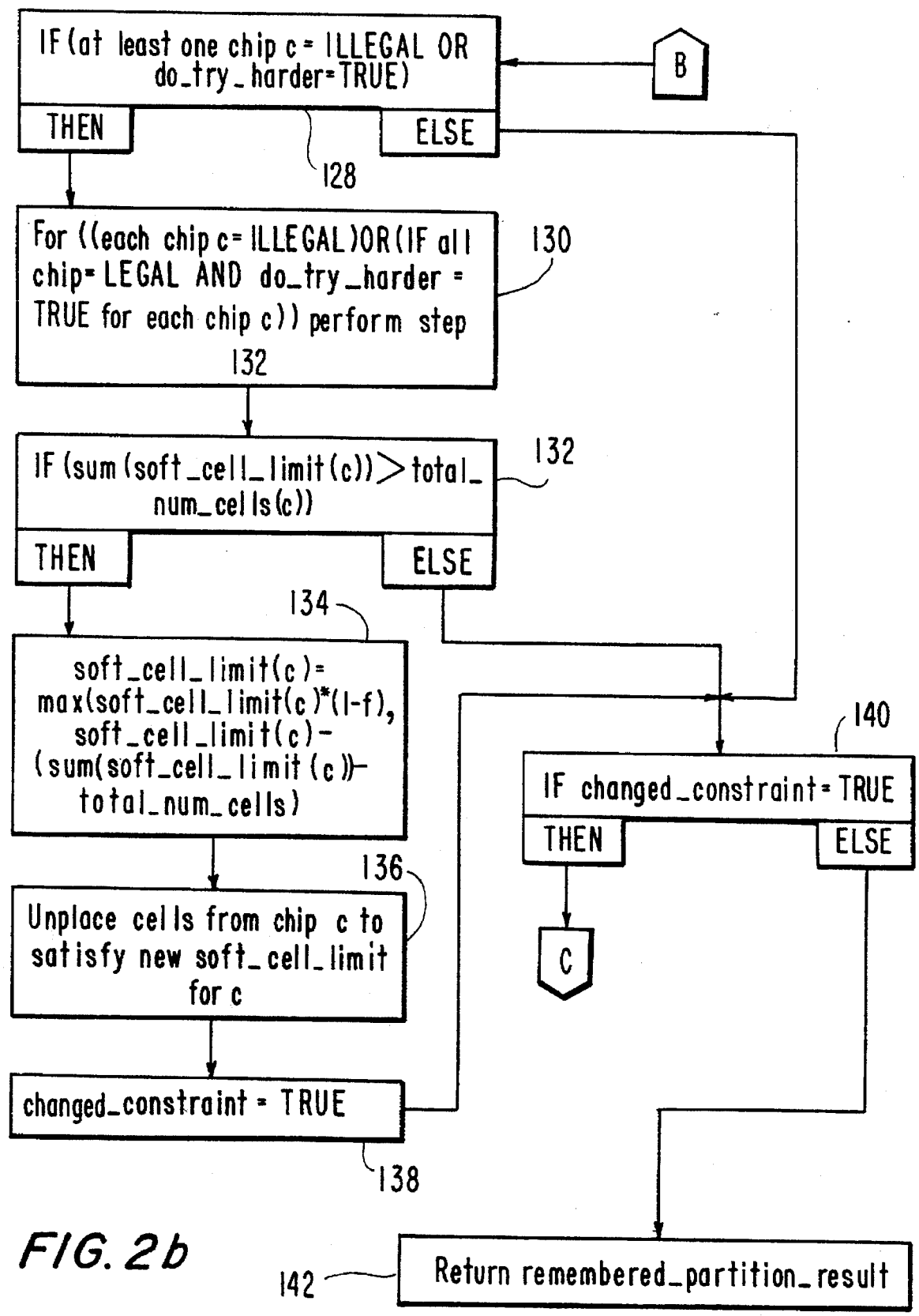
Figure 2C:
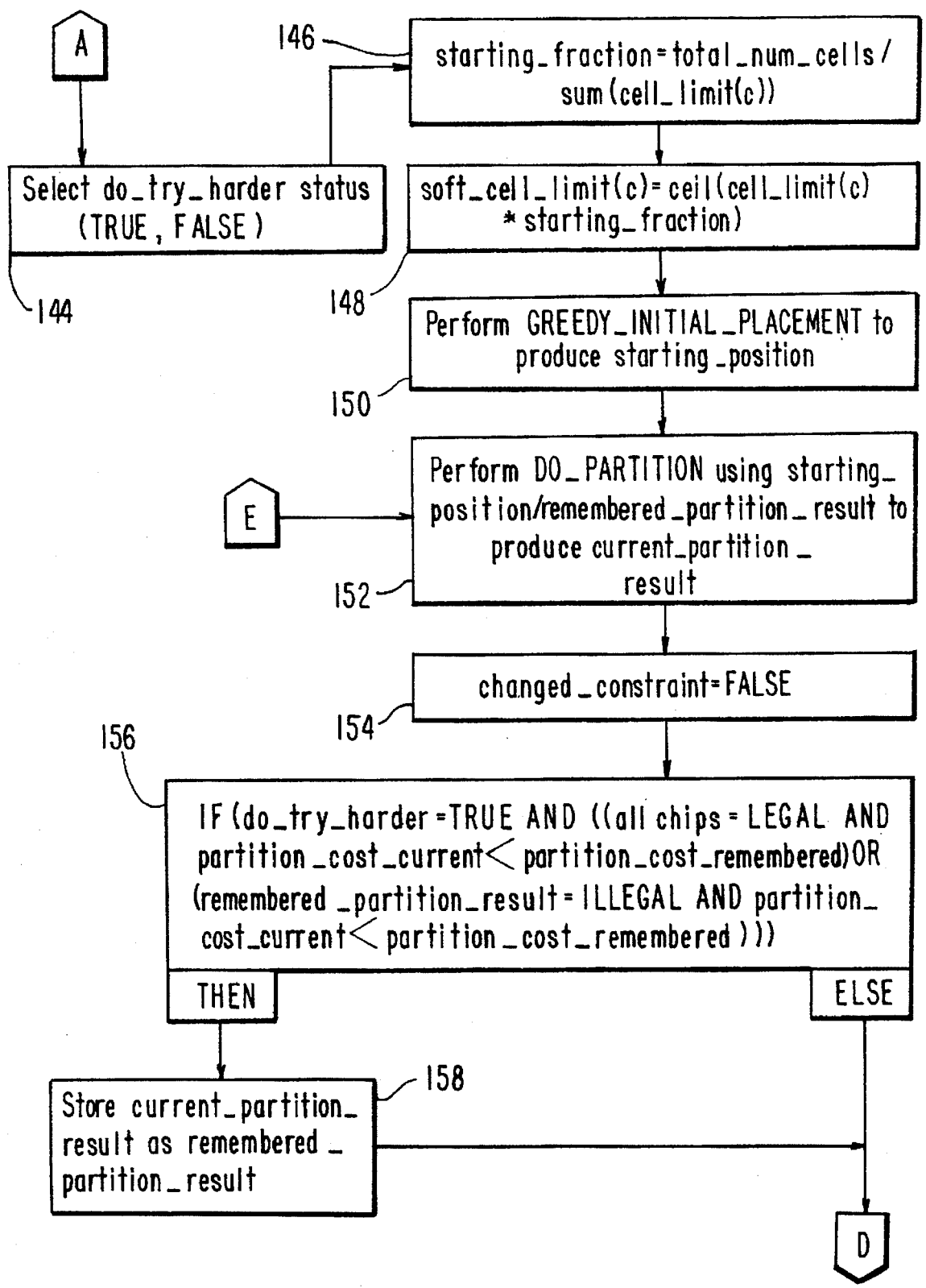
Figure 2D:
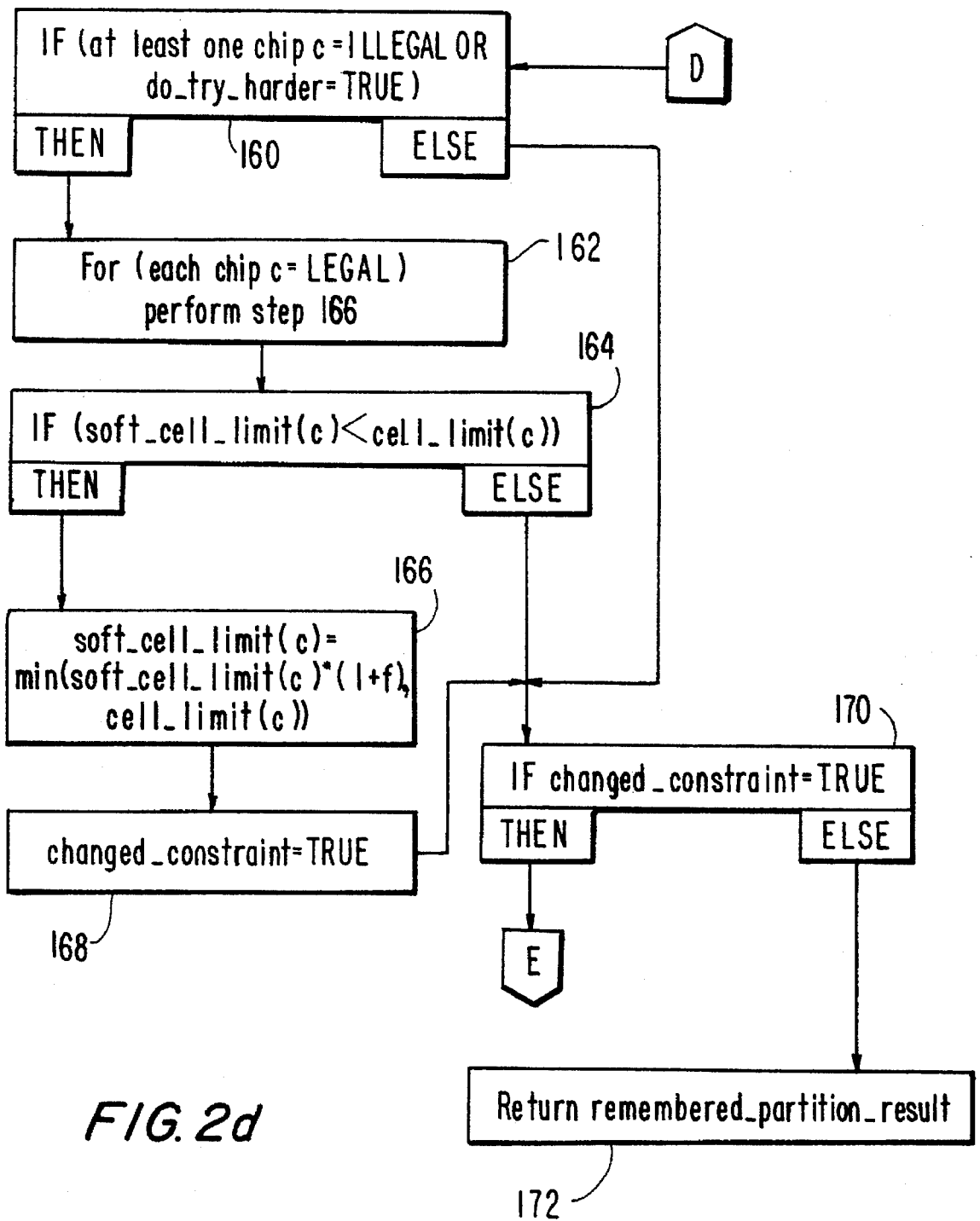

Although the improvements of this invention can be implemented in other contexts, in the presently preferred embodiment they are implemented by expanding and using the methods shown and described in reference (5) above, which itself is an expansion of and an improvement to reference (4). Because references (4) and (5) are thorough, complete, and detailed, it will not be necessary to repeat the substance of references (4) and (5) beyond what has been said above. Instead, only the modifications to what is shown and described in reference (5) in accordance with this invention are discussed below.

Preliminarily, it should be noted that whereas the following detailed discussion refers for the most part to partitioning a circuit between two circuit element groups, the methods of this invention can be employed in partitioning a circuit into a larger number of groups. As in the prior art, only two groups are considered at any one time, but the method is repeated for each pair of circuit groups one after another. Thus, if there were four circuit groups (numbered 1-4), the method would be performed successively for the following pairs of groups: 1,2; 1,3; 1,4; 2,3; 2,4; and 3,4. When partitioning between any two groups, cells in the other groups are considered to be outside or external to the circuit being partitioned.

A. Definitions of Variables, Functions, and Relationships as Used in the Present Invention Before describing the present invention in greater detail, it would be helpful to define the variables, functions and their relationships as they are used in the present invention. FIG. 1 shows symbols used in subsequent figures. (FIG. 1 is used for this material because some of it is too typographically complex to include in this written specification.)

A circuit is defined as a collection of circuit element groups involved in partitioning. A chip "c" is defined as a circuit element group involved in the partitioning process. A cell "C" is defined as a circuit element or a collection of circuit elements called a block (such as a master cell from reference (5) FIG. 5). Partitioning_priority is a parameter with one of two possible values (MIN_INTERCONNECT and MAX_RESOURCE_USE), representative of the design goal of a particular partitioning operation. MIN_INTERCONNECT indicates that the main goal of the current partitioning operation is minimization of interconnections between chips. On the other hand, MAX_RESOURCE_USE indicates that the main goal of the current partitioning operation is maximum utilization of each chip's resources (e.g., spreading the cells out as evenly as possible among the chips). Do_try_harder is a parameter with one of two possible values (TRUE and FALSE) which determines whether the partitioning operation stops after the first working partition is found (if do_try_harder is set to FALSE), or whether the partitioning operation performs many passes and returns the best partition found (if do_try_harder is set to TRUE).

Total_num_cells is a variable representative of the total number of cells in the circuit. Chip constraints restrict or encourage particular cell placement or movement, and may include but are not limited to: space available on a chip, maximum number of I/O pins allowed per chip, and requirements that certain chips must be connected to one another. The various chip constraints are described in greater detail in the prior art references (1) through (5). Several chip constraints are of particular importance in the present invention: cell_limit(c) and soft_cell_limit(c).

Cell_limit(c) is a variable representative of the number of cells a particular chip can hold. Cell_limit(c) may be different for each chip, thus allowing chips of various sizes in a circuit. Soft_cell_limit(c) is a chip constraint imposing an artificial limit on the number of cells a particular chip can hold. The sum of soft_cell_limits of all chips must be greater than or equal to total_num_cells, otherwise it would be impossible to place all the cells. In addition, for each chip c, soft_cell_limit(c) must be less than or equal to cell_limit(c) for that chip, i.e., the soft_cell_limit(c) chip constraint is limited by the cell_limit(c) which represents actual physical space available on the chip. A chip c for which one or more chip constraints (e.g., soft_cell_limit, etc.) are violated during partitioning has an ILLEGAL status. On the other hand, if all chip constraints on a chip c are satisfied, the chip has a LEGAL status.

GREEDY_INITIAL_PLACEMENT is a well-known class of algorithms for initial placement of cells into chips, where cells are placed one at a time, and where each placement decision is based on the position of the previously placed cells and a generic function which determines the next cell to be placed and the best placement for that cell. Once a cell is placed, it is never unplaced under a GREEDY_INITIAL_PLACEMENT. Starting_position represents the position of all the cells in, and all interconnections between, the chips in the circuit after GREEDY_INITIAL_PLACEMENT is completed. DO_PARTITION represents a partitioning operation which involves the movement of cells between chips to achieve an optimal partition as described in references (1) through (5). Preferably, DO_PARTITION represents a partitioning operation as is described in reference (5). Current_partition_result represents the position of all the cells in, and all interconnections between, the chips in the circuit after DO_PARTITION is performed on the circuit. Remembered_partition_result represents the position of all the cells in, and all interconnections between, the chips in the circuit which is stored as the best partition achieved from all previously performed partitioning operations. Remembered_partition_result for which one or more circuit constraints have been violated has an ILLEGAL status. However, if remembered_partition_result satisfies all circuit constraints, it has a LEGAL status.

Changed_constraint is a parameter with one of two possible values (TRUE and FALSE) which indicates whether another partitioning operation will take place with a changed soft_cell_limit(c) for one or more chips (if the changed_constraint is TRUE), or whether no further partitioning will take place after the current partitioning operation (if the changed constraint is FALSE).

Figure 3:
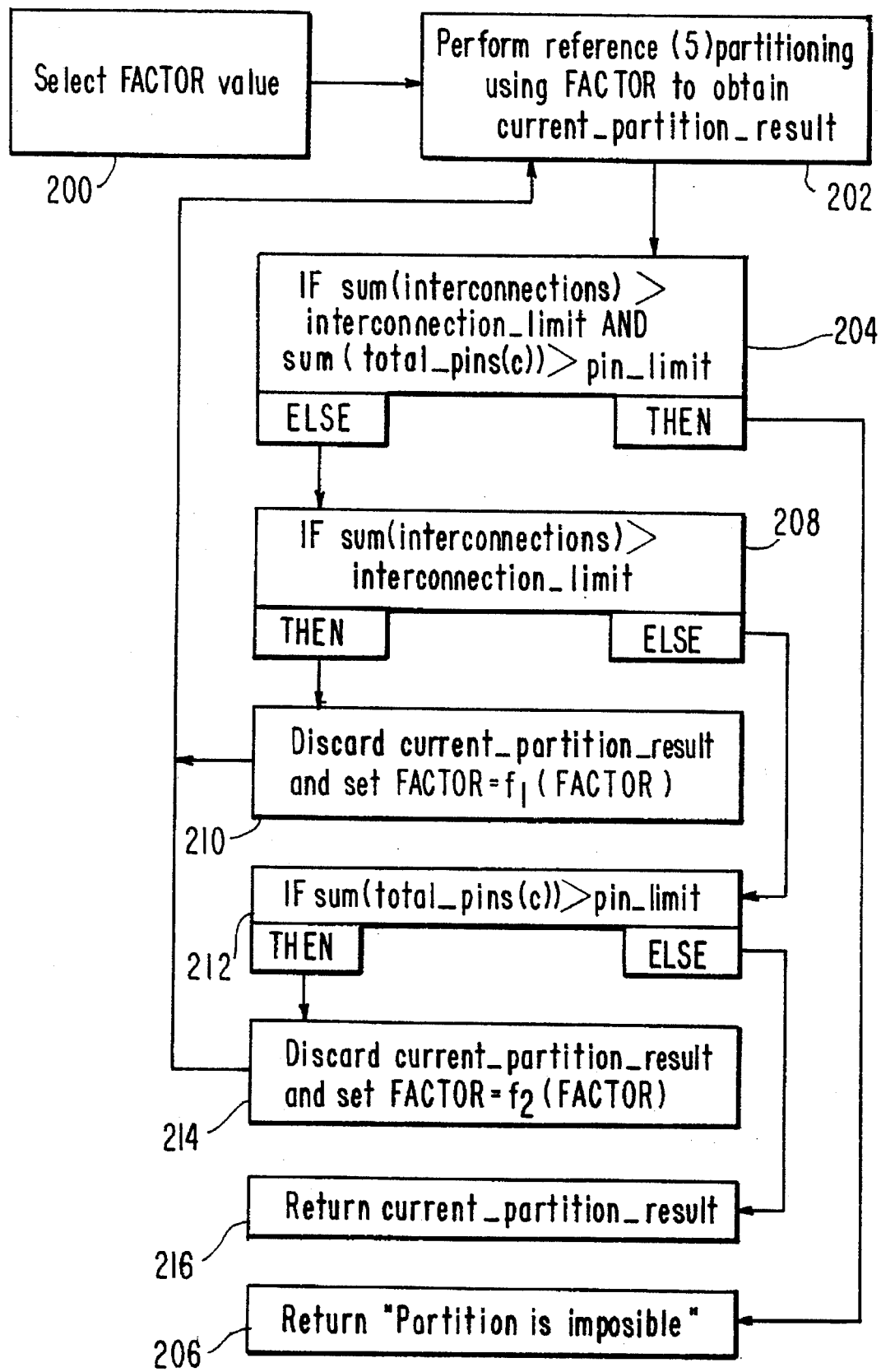
FIG. 3 is a flow chart of an illustrative embodiment of a second aspect of the invention.

A gain cost function for a chip c (FIG. 1, line 1) is the gain vector as computed in step 118 of FIG. 3 of reference (5). The gain cost function is an increasing function of the total number of I/O pins and interconnections created and eliminated after a particular cell is moved. FACTOR is a constant which is used in FIG. 3 of reference (5) to compute gain vector elements which form the gain vector (i.e., the gain cost function). The gain cost function considers the relative importance between a new I/O pin on an existing net and a new interconnection in terms of a tradeoff ratio of 1:FACTOR. In references (1)–(4), FACTOR was set to "1", reference (5) increased FACTOR to "2" in cases when the chips being partitioned have no external connections. In accordance with the present invention, FACTOR is a user selectable value with no limit on magnitude.

Partition_cost is a function of the number of interconnections between the chips in the circuit at the end of a partitioning operation. Thus, each partition_result has a partition_cost associated with it. Partition_cost is typically derived by adding FACTOR for every interconnection between the two chips being partitioned that is not connected to other chips in the circuit, and adding "1" for every interconnection between the two chips being partitioned that is connected to other chips in the circuit. Minimization of the partition_cost is an important objective during a partitioning operation because the smaller the partition_cost is, the closer a particular partition_result is to the optimal partition. Partition_cost_current is partition_cost of current_partition_result, while partition_cost_remembered is partition_cost of remembered_partition_result.

The variable "f" is a number between "1" and "0" representative of the increment by which soft_cell_limit(c) is changed during each partitioning pass. The function sum(variable(x)) is a summation of variable(x) values for each x. The function min(A,B) compares variables A and B and returns the lesser of the two. The function max(A,B) compares variables A and B and returns the greater of the two. The function ceil(A) rounds a variable A up to the nearest integer. For example, ceil(4.01) returns "5."

Sum(interconnections) is a function representing the total number of interconnections in the circuit being partitioned. Interconnection_limit is a circuit constraint which represents the maximum number of interconnections possible in the circuit being partitioned. Total_pins(c) is a variable representative of the number of I/O pins in any chip c. Note that total_pins(c) may vary between individual chips. Sum (total_pins(c)) is a function representing the total number of I/O pins in the circuit being partitioned. Pin_limit is a circuit constraint which represents the maximum number of I/O pins possible in the circuit being partitioned. Pin_limit (c) is a chip constraint which represents the maximum amount of I/O pins possible in a particular chip c. Note that in order for a partition to be successful both of the following must be true: sum(interconnection) must be less than or equal to interconnection_limit, and total_pins(c) must be less than or equal to pin_limit(c) for all chips c.

Increasing function controls positive adjustments made to FACTOR in accordance with the present invention. Examples of increasing function may include, but are not limited to: adding a constant to FACTOR, multiplying FACTOR by a constant, increasing FACTOR by a fraction of the amount FACTOR was increased by on the previous partition pass, and increasing FACTOR by a variable depending on the number of I/O pins and interconnections in the circuit. In a similar manner, decreasing function controls negative adjustments made to FACTOR in accordance with the present invention. Examples of decreasing function may include, but are not limited to: subtracting a constant from FACTOR, dividing FACTOR by a constant, decreasing FACTOR by a fraction of the amount FACTOR was decreased by on the previous partition pass, and decreasing FACTOR by a variable depending on the number of I/O pins and interconnections in the circuit.

B. Partitioning Method with Multiple Starting Positions Using Greedy Initial Placement and Prioritization of Partitioning Goals In a first aspect of the present invention, an improved partitioning method which combines the advantages of greedy initial placement and multiple starting positions is implemented by first using greedy initial placement to place chips and then changing chip constraints (in particular, the available space for cells in each circuit element group) on each subsequent partitioning pass. As a result of new chip constraints on each partitioning pass, subsequent partitioning operations begin at new starting positions on each pass while taking advantage of the original optimal cell positions due to greedy initial placement. Furthermore, prioritization of the partitioning goals of interconnection minimization and resource utilization efficiency is accomplished in accordance with the present invention by controlling the manner in which the chip constraints are initially selected, and the manner in which the chip constraints are changed during each subsequent partitioning pass.

In summary, if the design goal of the partitioning operation is to minimize interconnections, soft_cell_limit(c) is initially set to cell_limit(c) in order to maximize each chip's cell capacity. If do_try_harder is set to TRUE, after initial cell placement and partitioning, soft_cell_limit(c) is reduced on each subsequent partition repetition for certain chips by a predetermined amount. As a result, each subsequent partition repetition has a new starting point and thus produces a different result. During each partitioning pass, the current partition result is compared to the previous partition result. The partition result with the lowest partition_cost is stored. At the end of the partitioning operation, the stored partition result is returned as the optimal solution. Since the chips start with maximum available cell capacity, partitioning is less restricted on initial passes and thus provides a natural clustering of cells which leads to fewer interconnections (and thus a lower partition_cost) and improved circuit speed.

If the design goal of the partitioning operation is to maximize chip resources and to evenly distribute cells among chips, soft_cell_limit(c) is initially set to a fraction of each chip s cell_limit(c). If do_try_harder is set to TRUE, after initial cell placement and partitioning, soft_cell_limit(c) is increased on each subsequent partition pass for certain chips by a predetermined amount with a maximum value limited by cell_limit(c). As a result, each subsequent partition repetition has a new starting point and thus produces a different result. During each partitioning pass, the current partition result is compared to the previous partition result. The partition result with the highest partition_cost is stored. At the end of the partitioning operation, the stored partition result is returned as the optimal solution. Since the chips start with a fraction of their actual cell capacity, cells are fitted into chips more tightly and evenly during partitioning, thus utilizing chip resources with greater efficiency.

Referring to FIG. 2, the partitioning operation in accordance with the first aspect of the present invention begins at step 110 where the user selects a value for partitioning_priority (MIN_INTERCONNECT or MAX_RESOURCE_USE) which determines the manner in which the chip constraint parameters are initially selected, and the manner in which the chip constraints are changed during each subsequent partitioning repetition. At step 112, if partitioning_priority is set to MIN_INTERCONNECT, the partitioning operation proceeds to step 114. If partitioning_priority is set to MAX_RESOURCE_USE, the partitioning operation proceeds to step 144. At step 114 the user selects do_try_harder status which determines whether the partitioning operation will stop after the first partition with a LEGAL status is found, or whether the partitioning operation will be performed several times and the best result returned.

At step 116, soft_cell_limit(c) is set to cell_limit(c) for every chip c. This step allows each chip to start with maximum cell capacity. At step 118, GREEDY_INITIAL_PLACEMENT is performed on the unplaced cells to produce starting_position which is used as a starting point for subsequent partitioning. During the first partitioning operation pass all cells are unplaced, while during subsequent passes only some cells are unplaced. At step 120, DO_PARTITION is performed on the cells which are at starting_position to produce current_partition_result. At step 122, changed_constraint is set to FALSE to reflect the fact that soft_cell_limit(c) has not been changed from its initial value.

At step 124, several conditions are specified which determine whether current_partition_result is to be stored as remembered_partition_result. During the first partitioning operation pass, partition_cost_remembered is treated as zero since remembered_partition_result is not available yet. If the conditions specified are satisfied, then, at step 126, current_partition_result is stored as remembered_partition_result. Otherwise, the partitioning operation proceeds to step 128. At step 128 a condition is specified which determines whether the soft_cell_limit(c) will be reduced for the next partition pass for certain chips. If the condition specified is satisfied, the partitioning operation proceeds to step 130. Otherwise, the partitioning operation proceeds to step 142. At step 130, chips for which the soft_cell_limit(c) will be reduced are identified so that step 132 may be performed for each such chip. At step 132, a further condition is specified which determines whether the soft_cell_limit(c) will be reduced for the next partitioning operation pass for chips identified at step 130. For any chip c for which the condition specified in step 130 is satisfied, at step 134 soft_cell_limit(c) is lowered by the specified fraction f. The "max" function ensures that the soft_cell_limit(c) is not lowered to a value so small that the sum(soft_cell_limit(c) is less than the total_num_cells, because then there will not be enough room to place all of the cells. Otherwise, the partitioning operation proceeds to step 140.

Since a lower soft_cell_limit(c) results in lower cell capacity, certain chips may contain more cells than allowed by the lowered soft_cell_limit(c). Thus, at step 136, excess cells are temporarily removed from each chip where the new soft_cell_limit(c) is below the actual number of cells in that chip. At step 138, changed_constraint is set to TRUE since soft_cell_limit(c) has been set to a lower value for ILLEGAL chips.

At step 140, a condition is specified which determines whether the partitioning operation will proceed with an additional pass or be ended with the current operation. If the condition is satisfied, the partitioning operation returns to step 118, where GREEDY_INITIAL_PLACEMENT is performed on cells temporarily removed from certain ILLEGAL chips in step 136. The partitioning operation then continues as described above. If the condition is not satisfied, the partitioning operation proceeds to step 142 where remembered_partition_result is returned as the best partition found.

If at step 110 partitioning_priority was set to MAX_RESOURCE_USE, at step 112 the partitioning operation was directed to step 144. At step 144, the user selects do_try_harder status which determines whether the partitioning operation will stop after the first partition with a LEGAL status is found, or whether the partitioning operation will be performed several times and the best result returned.

At step 146, a starting_fraction variable is derived. Starting_fraction determines the amount by which cell_limit(c) for all chips is lowered to obtain soft_cell_limit(c). Soft_cell_limit(c) is calculated at step 148. This step allows each chip to start with an artificially lowered cell capacity. At step 150, GREEDY_INITIAL_PLACEMENT is performed on the cells to produce starting_position which is used as a starting point for subsequent partitioning. At step 152, DO_PARTITION is performed on the cells which are at starting_position to produce current_partition_result. At step 154, changed_constraint is set to FALSE to reflect the fact that soft_cell_limit(c) has not been changed from its initial value.

At step 156, several conditions are specified which determine whether current_partition_result is to be stored as remembered_partition_result. During the first partitioning operation pass, partition_cost_remembered is treated as zero since remembered_partition_result is not available yet. If the conditions specified are satisfied, then at step 158 current_partition_result is stored as remembered_partition_result. At step 160, a condition is specified which determines whether the soft_cell_limit(c) will be increased for the next repetition for certain chips. If the condition specified is satisfied the partitioning operation proceeds to step 162. Otherwise the partitioning operation proceeds to step 170. At step 162, chips which have an LEGAL status are identified so that step 164 may be performed for each such chip. At step 164 a further condition is specified which determines whether soft_cell_limit(c) will be increased for the next partitioning operation pass for chips with a LEGAL status.

For each chip with a LEGAL status for which the condition specified is satisfied, at step 166 soft_cell_limit(c) is increased by the specified fraction f, not to exceed cell_limit(c). Otherwise, the partitioning operation proceeds to step 170. At step 168 changed_constraint is set to TRUE since soft_cell_limit(c) has been set to a higher value for certain cells.

At step 170, a condition is specified which determines whether the partitioning operation will proceed with an additional pass or be ended with the current operation. If the condition is satisfied, the partitioning operation returns to step 152, where DO_PARTITION is performed on the circuit using new soft_cell_limit(c) for certain cells. The partitioning operation then continues as described above. If the condition is not satisfied, the partitioning operation proceeds to step 172 where remembered_partition_result is returned as the best partition found.

C. Dynamic Gain Cost Function

In a second aspect of the present invention, an improved partitioning method, which allows a user to adjust the weight of the benefits for eliminating existing interconnections and the weight of the penalties for adding new interconnections in accordance with a design goal, is implemented by initially selecting a gain cost modifier, which determines the weight of benefits and penalties for eliminating and adding interconnections, respectively. If initial partitioning fails, multiple partitioning passes are performed, dynamically modifying gain_cost on each pass by changing the gain cost modifier until a successful partition is found.

Referring to FIG. 3, the partitioning operation in accordance with a second aspect of the present invention begins at step 200 where the user selects a value for FACTOR. The value of FACTOR reflects the relative importance of eliminating or adding interconnections versus eliminating or adding I/O pins. As described above, a high FACTOR indicates that elimination of interconnections is significantly more important than elimination of I/O pins. At step 202, a reference (5) partitioning operation is then performed using FACTOR in steps 114 and 116 of FIG. 3 of reference (5) to obtain current_partition_result. At step 204, a condition is specified which determines whether a partition is possible for any value of FACTOR. If the condition specified is satisfied, the partitioning operation then proceeds to step 206 where the user is informed that a partition of this particular circuit is impossible to obtain for any value of FACTOR.

If the condition specified at step 204 is not satisfied, at Step 208, sum(interconnections) is compared to interconnection_limit. This step determines if current_partition_result fails due to violation of the interconnection_limit constraint. This may occur if the value of FACTOR is too low. If sum(interconnections) is greater than interconnection_limit, current_partition_result is invalid and the partitioning operation proceeds to step 210. Otherwise, the partitioning operation proceeds to step 212. At step 210, current_partition_result is discarded and FACTOR is increased via the increasing function so that new interconnections are more costly. The partitioning operation then returns to step 202 for the next partitioning pass using the new, higher FACTOR.

At step 212, sum(total_pins(c)) is compared to pin_limit. This step determines if current_partition_result fails due to violation of the pin_limit constraint. This may occur if the value of FACTOR is too high. If sum(total_pins(c)) is greater than pin_limit, current_partition_result is invalid and the partitioning operation proceeds to step 214. Otherwise, current_partition_result is successful and the partitioning operation proceeds to step 216. At step 214, current_partition_result is discarded and FACTOR is decreased via the decreasing function so that new interconnections are less costly. The partitioning operation then returns to step 202 for the next partitioning pass using the new, lower FACTOR. At step 216, current_partition_result is returned as the successful partition.

It will be understood that the foregoing is merely illustrative of the principles of this invention and that various modifications can be made by those skilled in the art without departing from the scope and spirit of the invention. For example, the foregoing partitioning method enhancements can be used in any combination as desired. If some are not needed, they can be eliminated, and only the others used.

The invention claimed is:

1. A method for partitioning a plurality of circuit elements within a plurality of circuit groups, the method of partitioning comprising the steps of:

(a) initially placing the plurality of circuit elements in accordance with a greedy initial placement method subject to at least one partitioning constraint associated with each circuit group of the plurality of circuit groups, and also subject to at least one physical constraint also associated with each circuit group of the plurality of circuit groups;

(b) performing a standard partitioning operation in which a partition cost variable is computed which indicates the number of connections required between each circuit group of the plurality of circuit groups with the objective of reducing the number by moving circuit elements from at least one of the plurality of circuit groups to another of the circuit groups in order to obtain a partition result indicative of the position of each of the plurality of circuit elements, wherein the partition result is associated with the partition cost variable;

(c) comparing the partition cost variable obtained at step (b) with a previously obtained partition cost variable, and storing the partition result obtained at step (b) if its associated partition cost variable is less than the previously obtained partition cost variable;

(d) identifying one or more circuit groups of the plurality of circuit groups that violate one or more of said at least one partitioning constraint, and proceeding to step (g) if no such circuit groups exist;

(e) changing one or more of said at least one partitioning constraint for all circuit groups identified at step (d);

(f) repeating step (a) using one or more of said at least one partitioning constraint changed at step (e); and (g) returning the partition result stored at step (c).

2. The method of claim 1, wherein said at least one physical constraint comprises a capacity limit indicative of the maximum amount of circuit elements that may be placed into a particular circuit group from the plurality of circuit groups, wherein each of the plurality of circuit groups may have varying capacity limits.

3. The method of claim 2 further comprising the step of:

(h) assigning a first status to the partition result obtained at step (b) if it is determined at step (d) that none of the plurality of circuit groups violate one or more of said at least one partitioning constraint, and assigning a second status to the partition result if it is determined at step (d) that at least one of the plurality of circuit groups violate one or more of said at least one partitioning constraint.

4. The method of claim 3 further comprising the step of:
(i) selecting a value for a multiple pass variable from a first value and a second value, wherein:
if the first value is selected, the partitioning operation of steps (b) thru (g) stops after the first partition result having the first status is obtained, and wherein
if the second value is selected, the partitioning operation of steps (b) thru (g) is repeated until the partition result with the lowest partition cost variable is obtained.

5. The method of claim 2 further comprising the step of:
(j) selecting a partitioning priority from a plurality of design goals, the plurality of design goals comprising: minimization of the number of connections required between the two circuit groups, and maximization of resource use of the circuit element groups, this step being performed prior to step (a).

6. The method of claim 5 wherein said at least one partitioning constraint changed at step (e) comprises a capacity variable indicative of the maximum amount of circuit elements that may be placed into a particular circuit group, wherein the capacity variable for the particular circuit group must be lower than or equal to the capacity limit for that circuit group.

7. The method of claim 6, wherein the design goal selected at step (j) is the minimization of the number of connections required between the plurality of circuit groups, further comprises the step of:
(k) setting the capacity variable of each circuit group equal to the capacity limit for that circuit group, this step being performed prior to step (a).

8. The method of claim 7 wherein at step (e) the changing of the capacity variable comprises decreasing the capacity variable by a first programmable amount, wherein the total magnitude of the capacity variables for all circuit groups from the plurality of circuit element groups must be less than or equal to the total number of circuit elements in the plurality of circuit elements.

9. The method of claim 8 further comprising the steps of:
determining whether one or more circuit groups of the plurality of circuit groups violate their capacity variable by having a number of circuit elements which exceeds the capacity variable, this step being performed after step (e);
(m) unplacing circuit elements from the circuit group in violation of its capacity variable so that the number of circuit elements remaining in the circuit group is less than or equal to its capacity variable; and
(n) repeating step (a) so that the circuit elements unplaced at step (m) may be placed into one or more circuit groups of the plurality of circuit groups.

10. The method of claim 6, wherein the design goal selected at step (j) is the maximization of resource use of the circuit element groups, further comprising the step of:
(o) setting the capacity variable of each circuit group to a value equal to the capacity limit for that circuit group reduced by a second programmable amount, this step being performed prior to step (a).

11. The method of claim 10 wherein at step (e) the changing of the capacity variable comprises increasing the capacity variable by the first programmable amount, wherein the capacity variable for each circuit group may not exceed the capacity limit for that circuit group.

12. A method for partitioning a plurality of circuit elements between two circuit groups in accordance with the objective of maximizing a gain cost variable, wherein each circuit element comprises a first plurality of pins, wherein a first constraint limits the plurality of pins to its value, wherein the two circuit groups comprise a first plurality of interconnections between one another, wherein a second constraint limits the plurality of interconnections to its value, and wherein when a circuit element is moved from one of the circuit groups to the other of the circuit groups, a gain variable is increased by a first gain modifier for each pin from the plurality of pins which is eliminated during the move, decreased by the first gain modifier for each new pin added to the plurality of pins during the move, increased by a second gain modifier for each interconnection from the plurality of interconnections which is eliminated during the move, and decreased by a second gain modifier for each new interconnection added to the plurality of interconnections during the move, the method for partitioning comprising the steps of:

(a) selecting the second gain modifier;
(b) performing a standard partitioning operation in which an interconnections variable is computed which indicates the number of connections required between the two circuit groups with the objective of reducing the number by moving circuit elements from one of the circuit groups to the other of the circuit groups in order to obtain a partition result;
(c) determining a gain cost variable using the first and the second gain cost modifiers;
(d) determining if the partition result violates both the first and the second constraints, proceeding to step (j) if the partition result violates both the first and the second constraints, and proceeding to step (e) otherwise;
(e) determining if the partition result violates the second constraint, proceeding to step (f) if the partition result violates the second constraint, and proceeding to step (g) otherwise;
(f) discarding the partition result, decreasing the second gain cost modifier via a decreasing function, and returning to step (b);
(g) determining if the partition result violates the first constraint, proceeding to step (h) if the partition result violates the first constraint, and otherwise proceeding to step (i);
(h) discarding the partition result, increasing the second gain cost modifier via an increasing function, and returning to step (b);
(i) returning the partition result obtained at step (b);
(j) notifying a user that a partition is impossible to obtain.

* * * * *